United States Patent [19]

Baker et al.

[11] Patent Number: 5,003,429
[45] Date of Patent: Mar. 26, 1991

[54] ELECTRONIC ASSEMBLY WITH ENHANCED HEAT SINKING

[75] Inventors: Don L. Baker, Johnson City; Joseph Funari, Vestal, both of N.Y.; William F. Otto, Rochester, Minn.; Bahgat G. Sammakia, Johnson City; Randall J. Stutzman, Vestal, both of N.Y.

[73] Assignee: International Business Machines Corporation, Armonk, N.Y.

[21] Appl. No.: 551,232

[22] Filed: Jul. 9, 1990

[51] Int. Cl.$^5$ .............................................. H05K 7/20
[52] U.S. Cl. .................................. 361/386; 165/80.3; 165/185; 174/16.3; 357/81; 361/383; 361/398
[58] Field of Search ..................... 165/80.3, 185; 174/16.3; 357/80, 81; 361/383, 385–389, 398

[56] References Cited

U.S. PATENT DOCUMENTS

| | | | |
|---|---|---|---|
| 3,372,310 | 3/1968 | Kantor | 317/101 |
| 4,069,497 | 1/1978 | Steidletz | 357/80 |
| 4,521,829 | 6/1985 | Wessley | 361/387 |
| 4,561,011 | 12/1985 | Kohara et al. | 357/81 |
| 4,573,103 | 2/1986 | Nilsson | 361/386 |
| 4,698,663 | 10/1987 | Sugimoto et al. | 357/81 |
| 4,715,430 | 12/1987 | Arnold et al. | 165/80.3 |
| 4,748,538 | 5/1988 | Tsuji | 361/386 |
| 4,788,627 | 11/1988 | Ehlert et al. | 361/386 |
| 4,812,949 | 3/1989 | Fentan et al. | 361/386 |
| 4,823,234 | 4/1989 | Konishi et al. | 361/386 |
| 4,849,856 | 7/1989 | Funari et al. | 361/386 |
| 4,914,551 | 4/1990 | Anschel et al. | 361/389 |

OTHER PUBLICATIONS

IBM TDB, vol. 24, No. 1A (06/81), D. T. Conn et al.

Primary Examiner—Gregory D. Thompson
Attorney, Agent, or Firm—Lawrence R. Fraley

[57] ABSTRACT

An electronic package which includes at least two flexible circuitized substrates (e.g., thin film elements) connected at one location to a common first circuitized substrate (e.g., printed circuit board) and at another location to a semiconductor device, these subassemblies being located within a base member of the package. In one embodiment, a singular heat sink member is thermally coupled to a respective one of the semiconductor devices, and a common, second heat sink member is thermally coupled to all of the first heat sink members. This common heat sink member also uniquely serves as a stiffener for the package. In another embodiment, a common heat sink member is securely positioned on the opposite side of a first circuitized substrate from the plurality of flexible circuitized substrates and semiconductor devices. A base member is also used as part of this package. As in the aforementioned other embodiment, the common heat sink member also serves as a stiffener.

17 Claims, 4 Drawing Sheets

ELECTRONIC ASSEMBLY WITH ENHANCED HEAT SINKING

TECHNICAL FIELD

The invention relates to electronic packaging and particularly to electronic packages which utilize a heat sink as part thereof. As defined below, the invention even further relates to electronic packages which utilize thin film, flexible circuitized substrates.

BACKGROUND OF THE INVENTION

Electronic packages which include semiconductor devices (e.g., silicon chips) as part thereof are well known in the computer industry, with more recent examples being described and illustrated in U.S. Letters Pat. Nos. 4,849,856 (J. Funari et al) and 4,914,551 (M. Anschel et al). Both of these patents are assigned to the same assignee as the instant invention. Further, both utilize at least one flexible circuitized substrate as one of the electrically conductive elements thereof. The packages defined in these patents also include a heat sink and additional circuitized substrate members as part thereof. Accordingly, both of these patents are incorporated herein by reference.

Other examples of electronic packages which utilize semiconductor devices, heat sink members and various circuitized substrates are described and illustrated in U.S. Letters Pat. Nos. 4,069,497 (M. Steidlitz), 4,521,829 (H. Wessely), 4,561,011 (M. Kohara et al), 4,573,103 (P. Nilsson), 4,698,663 (M. Sugimoto et al), 4,715,430 (A. Arnold et al), 4,748,538 (M. Tsuji), 4,788,627 (M. Ehlert), 4,812,949 (J. Fontan et al) and 4,823,234 (A. Konishi et al).

Use of high circuit densities in modern semiconductor devices requires the effective removal of heat generated during package operation in order to assure that the operating parameters of such devices are maintained within specified tolerances so as to prevent destruction of the package from overheating and to assure proper functional performance of the package. One well known means for providing such heat removal is to utilize a metallic heat sink or similar member which typically forms an integral part of the package. Representative examples of these means are described and illustrated in the aforementioned several patents.

The electronic package of the instant invention includes a heat sink which not only enables effective heat removal of the package's semiconductor components but also, significantly, provides added reinforcement to and facilitates repair of the final package. Accordingly, individual repair and/or replacement of the semiconductor device and/or thin film flexible circuit connected thereto may be accomplished in a relatively facile manner without disturbing (e.g., physically contacting) other flexible circuitized substrates and semiconductor devices which also form part of this high density, composite package assembly. In one embodiment of the invention, this is accomplished using a first heat sink member for each semiconductor device and locating these member-device subassemblies strategically within the package (in substantially adjacent orientations). In this same embodiment, a singular common heat sink member is also utilized and positioned within the package in thermal contact with each of the individual heat sink members thermally connected to the respective semiconductor devices. This common heat sink member also uniquely serves as a stiffener such that the larger, common circuitized substrate (e.g., printed circuit board) is maintained in a substantially rigid, planar orientation.

In another embodiment of the invention, the flexible circuitized substrates and semiconductor devices are oriented on one side of the larger, common circuitized substrate while a common heat sink member is securedly positioned to an opposing side of this substrate. The heat sink also uniquely serves as a stiffener for the substrate in the final package assembly.

It is believed that an electronic package possessing the above features, among others, would represent a significant advancement in the art.

DISCLOSURE OF THE INVENTION

It is, therefore, a primary object of this invention to enhance the art of electronic packaging and particularly the packaging for use in information handling systems (e.g., computers) through the provision of an electronic package possessing the advantageous features defined herein.

It is another object of the invention to provide such a package which can be produced in an expeditious, cost-effective manner, and, significantly, which can be subjected to repair and/or replacement of various elements thereof without disturbing other key elements not requiring such repair and/or replacement.

In accordance with one aspect of the invention, there is provided an electronic package which includes a base member, a first circuitized substrate secured to the base member, at least two semiconductor devices electrically coupled to the first substrate, at least two flexible circuitized substrates, at least two first heat sink members each thermally coupled to a respective one of the semiconductor devices and a second, common heat sink member thermally coupled to each of the first heat sink members. The first and second heat sink members combine to provide a path for effective heat removal from each of the semiconductor devices during operation thereof, and the common heat sink member also functions as a stiffener member for the base and first substrate members.

In accordance with another aspect of the invention, there is defined an electronic package which includes a base member, a first circuitized substrate secured to the base member and including first and second, opposing sides, at least two semiconductor devices electrically coupled to the first substrate, at least two flexible substrates each electrically connected to the first of the two opposing sides of the first substrate, and a common heat sink member securedly positioned to the second opposing side of the first substrate and thermally coupled to each of the semiconductor devices. The flexible circuitized substrates and first circuitized substrate combine to provide a path for heat removal for each of the semiconductor devices to the common heat sink member during operation of the semiconductor devices. The common heat sink member also functions as a stiffening member for the first circuitized substrate.

BEST MODE FOR CARRYING OUT THE INVENTION

For a better understanding of the present invention, together with other and further objects, advantages and capabilities thereof, reference is made to the following disclosure and appended claims in connection with the above-described drawings.

In the description provided below, like numerals will be provided to describe like components.

Figure 1:
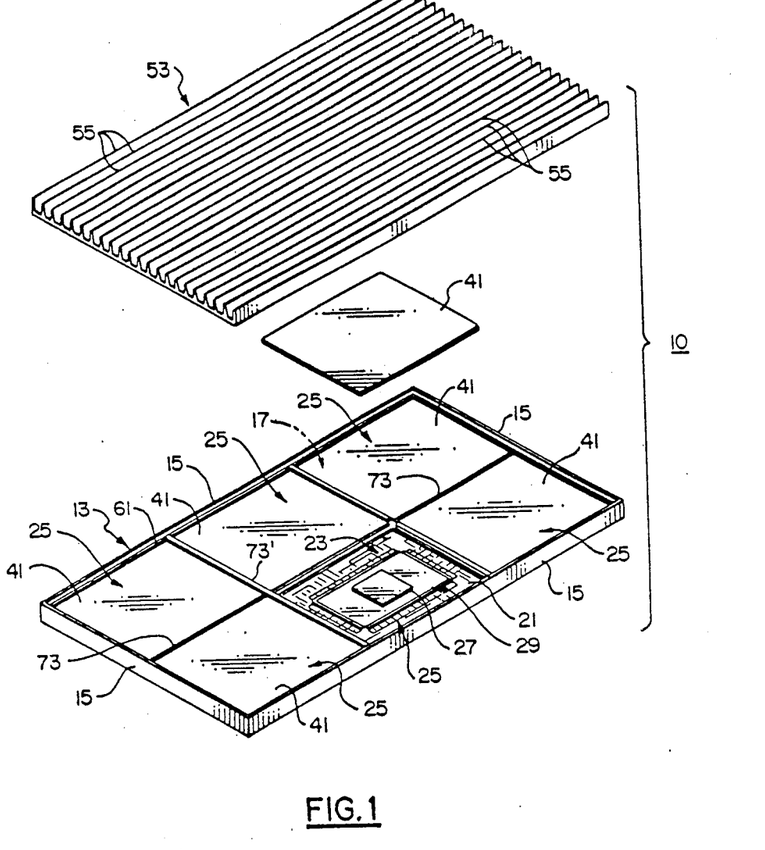
FIG. 1 is an exploded perspective view of an electronic package in accordance with one embodiment of the invention.

In FIG. 1, there is shown an electronic package 10 in accordance with a preferred embodiment of the invention. Package 10, as defined herein, provides, among others, three significant features: (1) enhanced heat sinking to thereby assure extended life for the package; (2) ease of repair and/or replacement of various elements thereof; and (3) a package of substantially rigid construction. As understood from the description herein, the invention can be produced relatively inexpensively and is also relatively adaptable to mass production.

Figure 2:
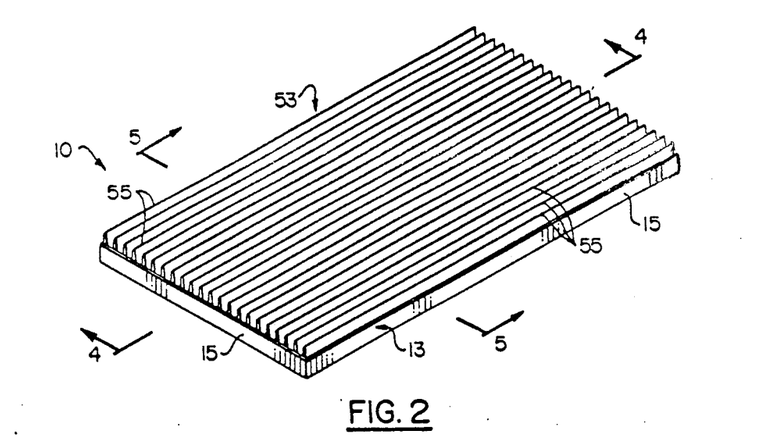
FIG. 2 is a perspective view of the package of FIG. 1 as assembled.
Figure 3:
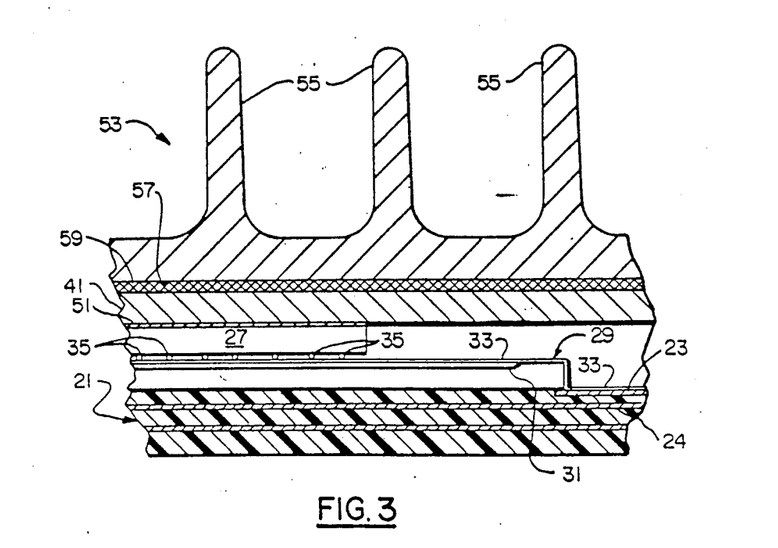
FIG. 3 is a partial side, elevational view, on a much enlarged scale and partly in section, of the package of FIGS. 1 and 2.
Figure 4:
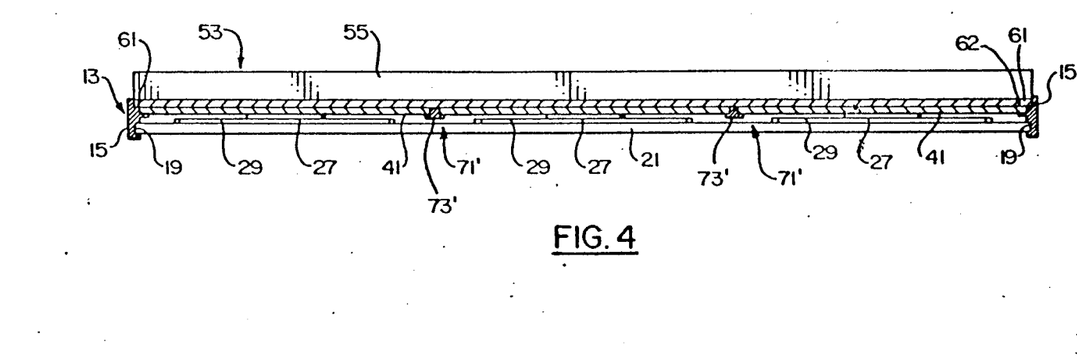
FIG. 4 is a side elevational view, partly in section and on a slightly enlarged scale, of the package of FIGS. 1 and 2 as taken along the line 4—4 in FIG. 2.
Figure 5:
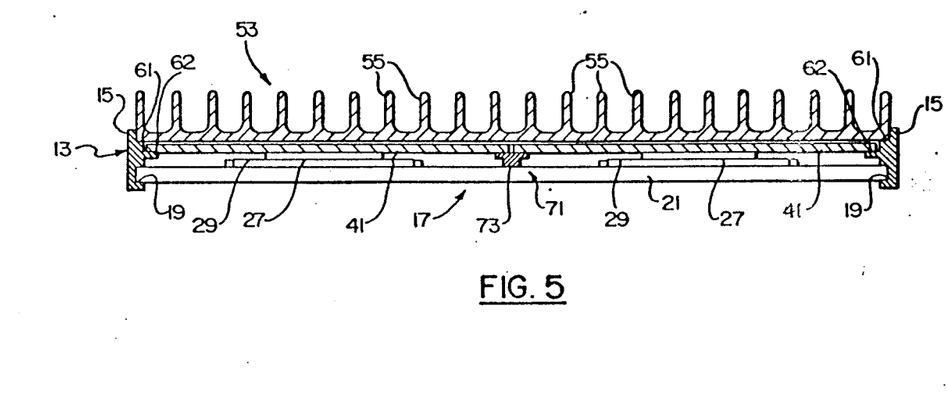
FIG. 5 is an elevational view, in section and on a slightly enlarged scale over that of FIG. 4, illustrating the package of FIGS. 1 and 2 as taken along the line 5-5 in FIG. 2 (the invention's first substrate not being shown in section in FIGS. 4 and 5, for clarification purposes)

Package 10, as shown in the exploded view in FIG. 1 and in the assembled view in FIG. 2, comprises a base member 13 of substantially rigid construction. Base member 13 is preferably metallic (e.g. aluminum) but may also be of a suitable rigid plastic material (e.g., a thermosetting plastic). Base member 13 is preferably of substantially rectangular configuration and, as shown in the drawing, is also preferably substantially planar. As seen in FIGS. 4 and 5, base member 13 includes a plurality (e.g., four) of upstanding sides 15 which define an open portion 17 therebetween. Each side 15 further includes an elongated channel 19 therein (FIGS. 4 and 5). Located within these four channels of sides 15 (and thus extending across the open portion 17 defined by base member 13) is a first circuitized substrate 21 which, in a preferred embodiment of the invention, is a printed circuit board (also referred to in the art as a printed wiring board). Substrate 21, if such a board, may be of known configuration, thus typically including one or more internal circuit lines (signal and/or power) located internally thereof. Further, as defined herein, substrate 21 also includes conductive circuitry (e.g., 23) on an upper surface thereof. Such circuitry, in both cases, may be of copper or other material known in the art. Further description of substrate 21 is thus not believed necessary. Examples of such internal circuitry and the surrounding dielectric material for such a substrate are shown in the cross-sectioned embodiment depicted in FIG. 3.

As stated, circuit boards, including those of the multi-layered variety are well known in the art. As is also known, electrical interconnections are possible between such conductive layers using known connective means (e.g., plated through holes). Thus, it is possible for purposes of the invention to provide such an electrical connection between the outer conductive circuitry 23 on substrate 21 and various internal conductive layers (e.g., layer 24), if desired. Substrate 21 preferably possesses a thickness within the range of from about 0.030 inch to about 0.200 inch, as is typical of many printed circuit boards of the known art. Understandably, such a relatively thin structure may be subject to bending or bowing if oriented in an unsupported position over somewhat extended distances. Additional support, to thus prevent such undesirable distortions, is considered essential in most applications.

Electronic package 10, as understood herein, provides an extremely large number of electrical connections and circuit paths in a relatively compact assembly. In one example, an electronic package possessing a total of six individual circuitized portions (as shown in FIG. 1) is capable of providing a total of about 200 I/O's (Input/Output locations) in a base member having width and length dimensions of only about 4.5 inch by 7.0 inch, respectively. (The length dimension being along the longest of the sides depicted in the rectangular structure of FIG. 2). Each individual circuitized portion 25 may in turn comprise from about 350 to 450 I/O's. Thus, many of these connection locations are being utilized in the invention to communicate between the individual circuitized portions. It is of course understood that the invention is not limited to providing only six circuitized portions but may be easily extended to include several more such portions, (e.g., thirty) if desired. Each of these substantially rectangular, circuitized portions is represented by the numeral 25 in FIG. 1.

As stated, package 10 includes a plurality (e.g., six) of individual circuitized portions or "compartments" 25 as shown in FIG. 1. Each compartment includes at least one semiconductor device 27 (e.g., silicon chip) which is designed for being electrically coupled to the common, first substrate 21. Only one such device is shown in FIG. 1 for illustration purposes. Thus, in the embodiment of FIG. 1, a total of six semiconductor devices are utilized, the remaining five not being shown.

Each semiconductor device is electrically coupled to the upper surface (therefore, by direct attachment) of substrate 21 using a flexible circuitized substrate member 29. Thus in the embodiment of FIG. 1, a total of six such flexible circuitized substrates are utilized, each respectively connected to one of the package's semiconductor devices.

Each flexible circuitized substrate 29 (see also FIG. 3) preferably comprises a thin layer of an organic dielectric material 31 (e.g., polyimide) having a defined layer of circuitry 33 (e.g., chrome-copper-chrome) formed thereon using techniques known in the art. Various circuit paths (leads) of circuitry 33 are electrically connected to corresponding, selected points of contact on the lower surface of device 27. Such connections may be achieved using a controlled collapse chip connection soldering technique known in the art, and further description is thus not believed necessary. These solder connections are represented, illustratively, by the plurality of solder balls 35. Alternatively, such connections may be obtained by thermocompression bonding. As depicted in FIG. 3, the opposing circuit paths (leads) of the flexible circuitized substrates are in turn electrically connected to designated circuitry (e.g., 23) on substrate 21 to thereby complete electrical coupling between device 27 and substrate 21. Additional electrical connections to substrate 21 may be made externally thereto from package 10 using various connective means (e.g., pins) and further description is thus not believed necessary. Such connection will thus facilitate utilization of package 10 in additional electronic packaging structures (e.g., mainframes), examples of which are known in the art. Further description of used in the instant invention is provided in U.S. Pat. No. 4,849,856, assigned to the same assignee as the instant invention. The disclosure of this patent is thus incorporated herein by reference.

In order to facilitate repair and/or replacement of these elements (e.g., semiconductor devices) in the event of failure thereof, without disturbing the remaining elements in package 10, and also to assure enhanced heat sinking for this high density assembly, each of the aforementioned circuitized compartments 25 includes its own individual heat sink member 41 (the heat sink 41 for the exposed flexible circuitized substrate 29 in FIG. 1 being shown in an elevated position with respect thereto for illustration purposes). Each of these individual first heat sink members (a total of six thus being used in the embodiment of FIG. 1) is preferably a substantially flat (planar), rectangular shaped member and has a thickness of only about 0.025 inch to about 0.250 inch. In the embodiment of FIG. 1 as described above, each heat sink 41 has length and width dimensions each of about 2.0 inches. Each heat sink 41 is preferably metallic, and more preferably a copper alloy. In one example, an alloy of copper/Invar/copper was utilized. (Invar is a trademark of the International Nickel Company). The invention is not limited to this material as it is understood that other thermally conductive materials may be used for each of the planar heat sink members 41.

Each first heat sink member 41 is directly attached and thus thermally coupled to a respective one of the semiconductor devices 27 (as shown in FIG. 3). Such connection may be accomplished in one of two ways. In the first, connection may be achieved using a known thermal adhesive possessing relatively high thermal conductivity. This adhesive is represented by the numeral 51 in FIG. 3.

The corresponding adhesive material 51 used at this interface was, in a preferred embodiment of the invention, silicone filled with a thermal conductive material (e.g., zinc oxide). Alternatively, an epoxy of a type known in the art, also having the aforementioned zinc oxide thermally conductive material as a filler, could also be readily utilized. One such composition, excluding this filler, is available from the Minnesota Mining and Manufacturing Corporation under the trade designation "Scotchcast". Such a composition contains about 47.6% by weight of an epoxy polymer, about 52% by weight of a hardener and flexibilizer mixture, and about 0.4% by weight of a coloring agent. The hardener and flexibilizer mixture contains about 25% to 39% of hexahydrophthalic anhydride, about 50% to about 75% by weight of a polypropylene glycol and/or polyoxypropylene glycol flexibilizer, about 0.85% to about 1% by weight of a tertiary amine (e.g., trimethyl amine), and a minor amount of hexahydrophthalic acid resulting from hydrolysis of the corresponding anhydride. The coloring agent employed is generally a mixture of chlorinated copper phthalocyanine on a titanium dioxide pigment. The filler, zinc oxide, is added to complete the composition.

Alternatively, each first heat sink member 41 may be removably secured to the corresponding semiconductor device 27 to thus facilitate removal of this first heat sink member. If this form of removal is desired, a suitable interface material is a thermal grease composition, several of which are known in the art. Such removal understandably enables only the first heat sink member to be initially separated, leaving the semiconductor device 27 and coupled flexible substrate 29 exposed (e.g., for subsequent repair).

Regardless of whether a permanent (adhesive) or removable (thermal grease) arrangement is used, it is understood from the foregoing that each of the individual semiconductor devices is directly thermally connected to the substantially larger heat sink members 41 positioned thereover. Each individual heat sink member thus also serves as a separate cover member or the like for each of the aforementioned circuitized compartments for package 10.

To further facilitate assembly, repair and/or replacement and enhanced heat removal for package 10, package 10 further includes a second, heat sink member 53 which is thermally coupled to each of the first heat sink members 41. As shown in FIG. 3, this second heat sink member 53 is located almost immediately over the respective first heat sink members 41. In a preferred embodiment, the second, common heat sink member 53 is of metallic material (e.g., aluminum) and includes a plurality of parallel, upstanding fins 55 as part thereof. As better seen in FIG. 3, common heat sink 53 preferably includes a substantially planar bottom surface 57 which aligns with the corresponding planar upper surface of each respective first heat sink 41. Second heat sink 53 is preferably thermally coupled to each first heat sink 41 using a known thermal grease, this material represented by the numeral 59 in FIG. 3. Such a thermal connection, being non-permanent in nature, thus even further facilitates removal of the second heat sink 53 in the event that repair and/or replacement to the underlying structure is deemed necessary.

It is thus understood from the foregoing that the two heat sink structures (the singular, common heat sink 53 and the individual planar first heat sinks 41) thus combine to provide a path for effective heat removal for the several semiconductor devices of package 10 during operation thereon. Such heat removal, as stated, is considered essential to assure a prolonged operational life for package 10.

In addition to providing effective heat removal and facilitating repair and/or replacement of package 10, common heat sink member 53 uniquely also functions as a stiffener member for base 13 (and thus the first substrate 21 located therein). As a stiffener, the second heat sink member 53 thus adds rigidity to the overall package structure. As better seen in FIGS. 4 and 5, this substantially rectangular shaped heat sink member 53 thus acts against the upstanding sides 15 of base 13 to prevent internal bending or similar distortion thereof and thus assure that these sides substantially maintain their desired substantially rectangular configuration. As further seen in FIG. 4 and 5, (and in FIG. 7) common heat sink member 53 rests upon a plurality of ledges 61, each of which are located substantially above the defined channels 19. That is, each upstanding side 15 includes at least one ledge 61 thereon such that a total of four such ledges are provided by base 13.

Common heat sink member 53 is not permanently attached to base 13 but instead is preferably frictionally inserted upon the receiving ledges 61 thereof. Should base 13 be of metallic (and thus heat conducting) construction, however, it is possible to utilize thermal grease or similarly sound thermally conductive material on ledges 61 at these locations of engagement with member 53. Thus, it is seen that common heat sink member 53 may be easily removed from package 10 such that individual repair and/or replacement to the circuitized compartments 25 remaining within the package's base 13 may occur. Such repair and/or replacement is then accomplished by removal of the respective planar heat sink member 41 and, if permanently attached, the associated semiconductor device and corresponding flexible circuitized substrate. Because each such substrate is typically connected to the circuitry on the common substrate 21 using solder or the like, removal of the flexible circuitized substrate can be readily accomplished using known techniques for effecting such disconnection.

In order to facilitate the aforementioned repair and/or replacement, and to assure effective placement of the individual first planar heat sink members 41 package 10 further includes means 71 (FIG. 5) and 71' (FIG. 4) for supporting the individual heat sink members 41, at the depicted elevated positions above the first substrate 21 such that each first heat sink will be positioned substantially parallel to the common first substrate and maintained at a spaced distance thereabove. Such spacing is essential in order to properly house the several semiconductor elements and associated flexible circuitized substrates between these first heat sinks and common substrate 21.

In one embodiment of the invention, the support means 71 comprises a beam member 73 (FIG. 1 and FIG. 5) which rests atop the upper surface of substrate 21 and, preferably, is secured thereto, (e.g. using a suitable adhesive). The upper, substantially flat surface of this standing type of support serves to accommodate the end segments of the respective planar heat sink members 41. In a preferred embodiment of the invention, each standing support beam member 73 preferably extends substantially the entire length of the package structure to thus substantially interconnect the narrower sides 15 of base 13. Thus, in FIG. 1, the centermost portion of beam 73 has been removed for illustration purposes. A standing type of support is preferred when traversing relatively long distances (e.g., 7.0 inch). This is not meant to limit the invention, however, in that several individual standing type beam structures may be used to cover the same distance.

Figure 7:
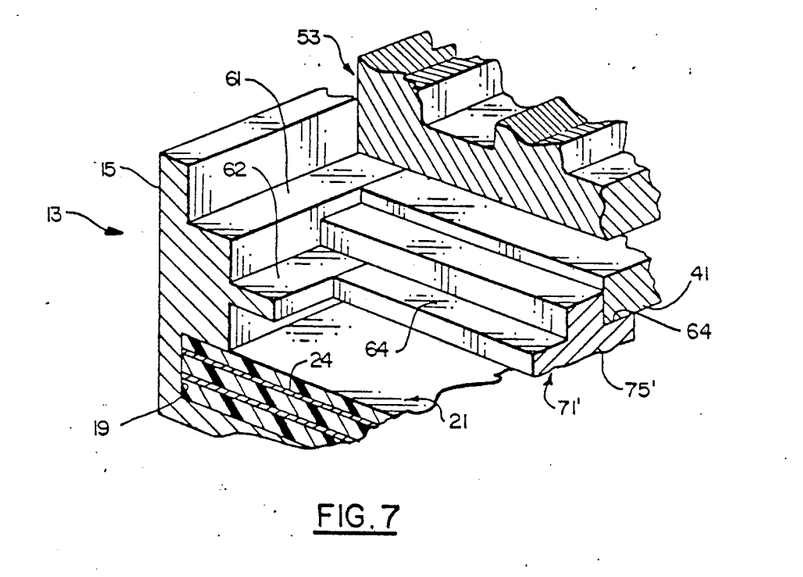
FIG. 7 is a much enlarged, partial perspective view illustrating one of the upstanding sides of the invention's base member and how this side accommodates various other members (e.g., first substrate, beam member, first heat sink member), which members are only partially shown.

As shown in FIG. 1, 4 and 7, the support means 71' may comprise an elongated beam member which is, in effect, free standing in that it does not engage the upper surface of substrate 21. Such an arrangement maximizes utilization of the substrate's upper surface area (e.g. for more circuitry). In a preferred embodiment, each such beam member is spacedly located above the substrate's upper surface and extends substantially across the narrower dimension of base 13. Specifically, each such support means 71' may comprise an elongated beam 73' which has its opposing end sections resting on a ledge 62 or the like formed on the opposing, longitudinal sides 15 of base 13. In such an arrangement, the internal portion of such spacedly positioned beam members would preferably rest on the standing beam 73 as it passes thereover. Such is not meant to limit the invention, of course, in that other combinations are readily possible, including extending this spaced beam substantially across the entire width of base 13 without providing some interior support.

The relative positioning of one such beam member 73', in addition to one of the first heat sink members 41, the common, upper heat sink member 53 and the invention's first substrate 21, with regard to one of the upstanding sides 15 of base 13 can be clearly seen in the enlarged, partial sectional view in FIG. 7. The end section of beam 73' is shown resting on a second ledge 62 located immediately below the upper ledge 61 designed to accommodate heat sink 53. It is understood that two such ledges 62 are used in this embodiment, each such ledge being formed in one of two opposite sides 15 (in FIG. 1, the two longitudinal sides) of base 13. Channel 19 can also be seen in the lower portion of side 15, this channel including substrate 21 seated therein. An end section of one of the planar first heat sink members is shown as resting on a respective one of two ledges 64 formed in the upper surface of beam member 73'.

Although two non-standing and one elongated, standing beam members have been shown, it is understood that other combinations are readily possible without limiting the invention. For example, it is possible in a package construction such as depicted in FIG. 1 to utilize only a pair of non-standing beam members to bridge the longitudinal sides 15 of base 13. It is also possible instead to use but a singular longitudinal beam member of the standing, supported variety and extend this between the narrower width sides 15. In either event, or when using combinations such as described herein, each of the beam support members will include a portion thereof designed to accommodate an end section of the respective planar first heat sink members 41 therein and/or thereon.

Each beam member as defined herein is preferably of metallic construction but may also be of other material (e.g., plastic). Metallic beam members are preferred to enhance heat removal for package 10. Regardless of material used, however, each beam member also preferably functions as an added stiffener element to add even more rigidity to base 13 (and thus substrate 21).

Figure 6:
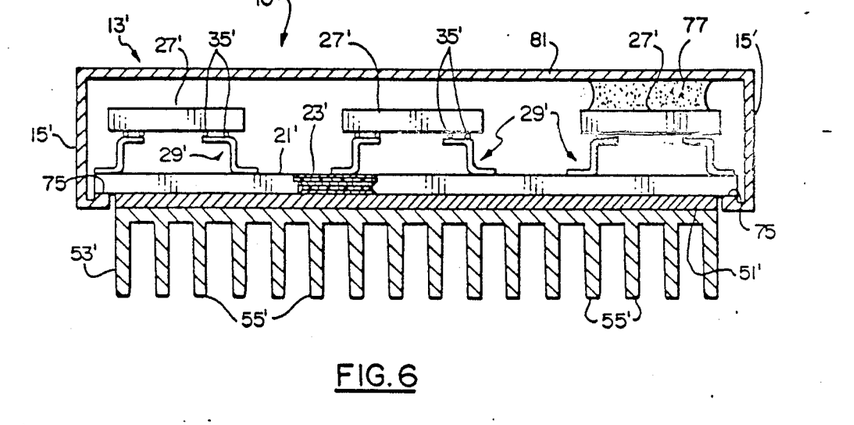
FIG. 6 is a side elevational view, in section, of an electronic package in accordance with another embodiment of the invention.

In FIG. 6, there is shown an electronic package 10' in accordance with another embodiment of the invention. Package 10 comprises a base member 13' having upstanding sides 15' which define a substantially rectangular structure having a plurality (e.g., four) of such sides. Sides 15', as with sides 15 in member 13, each include a channel or ledge 75 on which (or into which) a first, common circuitized substrate 21' is positioned. Preferably, substrate 21' need only rest on the ledge or channel 75 but is preferably held in position by other means (e.g., clamp) not shown. It is also understood that the opposing sides 15' of base 13' could each include a channel similar to channel 19 for base 13 to best receive the common substrate 21' therein. In FIG. 6, a plurality of semiconductor devices 27' are located on one side of substrate 21', with each being electrically connected to corresponding circuitry (e.g. 23') on the surface thereof using flexible circuitized substrates 29' similar to those substrates 29 in FIG. 1. As such, each flexible substrate 29' includes the aforementioned dielectric (e.g., polyimide) material and associated conductive paths (e.g., copper) as part thereof. Additionally, the inner leads of this flexible circuitized structure are preferably connected to respective contact points on the undersurface of each semiconductor device using the aforementioned solder connection. Such connections are represented by the numerals 35' in FIG. 6.

As also shown in FIG. 6, package 10' further includes a common heat sink member 53' which, uniquely, is secured (e.g., using a thermally conductive adhesive such as adhesive 51 defined above) to the opposite side of common substrate 21' from devices 27'. Such adhesive is represented by the numeral 51' in FIG. 6. Common heat sink 53' further preferably includes a plurality (e.g., 7 per linear inch) of upstanding fins 55' as part thereof. Common heat sink member 53' is thermally coupled to each of the semiconductor devices 27', allowing heat to pass from these semiconductor devices through the flexible circuitized substrates 21' to the common substrate 21' (preferably a multilayered circuit board as is substrate 21), through the thermally conductive adhesive 51' to the common heat sink member 53'. Although package 10' is shown in the orientation depicted in FIG. 6 such that the projecting fins 55' extend downwardly, it is understood that this package is fully capable of being operated in an inverted manner (such that fins 55' project upwardly in FIG. 6) without adversely affecting the operation of package 10'. This is also true for the embodiment for FIG. 1, in that package 10 is fully operational in an inverted orientation from that shown in FIGS. 1 and 2.

As in the embodiment of FIG. 1, the common heat sink member 53', in addition to providing an effective means for removing heat from package 10', also uniquely serves as a stiffener to prevent bowing or similar alteration to the planar substrate 21' (e.g. as may occur during high temperatures). To further facilitate heat removal from package 10', each of the semiconductor devices 27' may be thermally coupled to the adjacent side 81 of base 13' (e.g., using a thermal grease or adhesive 77). Heat removal is even further enhanced through utilization of a metallic or similar heat conductive material for base 13'.

The upstanding location for the semiconductor devices 27' in FIG. 6 is provided for illustration purposes only to represent that these devices are preferably oriented above the common substrate's upper surface. This is not meant to limit the invention, however, in that in the broader aspects of the invention, one or more of these semiconductor devices could be directly attached (electrically and/or physically) to the common substrate's upper surface. That is, one or more devices could be located on this upper surface and the contact locations thereof directly connected (e.g., soldered) to selected circuitry 23' without use of flexible substrates 29'. Additionally, is also possible to use a thermal grease or the like to serve as a thermal connection between the device's undersurface and the common substrate's upper surface.

Package 10', like package 10 in FIG. 1, thus enables removal of one part thereof (e.g., base 13') such that individual repair and/or replacement of one or more of the elements thereof (e.g., semiconductor devices 27', flexible circuitized substrates 29') can occur without disturbance to the remaining elements of this assembly. Equally significant, the common heat sink member provides for both effective heat removal for the package during operation thereof and also functions as a stiffener to provide additional desired rigidity to the overall structure.

Thus there have been described and shown an electronic package which facilitates repair and/or replacement to various individual elements thereof without disturbing the remaining elements. Such a package as defined, can be produced in a relatively facile manner, thus rendering the invention adaptable to mass production and the associated advantages thereof.

While there have been shown and described what are considered preferred embodiments of the invention, it will be obvious to those skilled in the art the various changes and modifications may be made therein without departing from the scope of the invention as defined by the appended claims.

What is claimed is:

1. An electronic package comprising:
 a base member;
 a first circuitized substrate secured to said base member;
 at least two semiconductor devices electrically coupled to said first circuitized substrate;
 at least two flexible circuitized substrates, each of said flexible circuitized substrates electrically connected to said first circuitized substrate and to a respective one of said semiconductor devices to provide said electrical coupling to said first circuitized substrate;
 at least two first heat sink members, each of said first heat sink members thermally coupled to a respective one of said semiconductor devices; and
 a second, common heat sink member thermally coupled to each of said first heat sink members, said first and second heat sink members providing a path for heat removal for each of said semiconductor devices during operation thereof, said common heat sink member also functioning as a stiffener member for said base member and said first circuitized substrate.

2. The electronic package according to claim 1 wherein said second heat sink is removably positioned within said package to thereby facilitate repair and/or replacement of selected ones of said flexible circuitized substrates and/or said semiconductor devices without requiring disturbance of others of said flexible circuitized substrates and/or said semiconductor devices.

3. The electronic package according to claim 2 wherein each of said first heat sink members is fixedly secured to a respective one of said semiconductor devices.

4. The electronic package according to claim 3 wherein each of said first heat sink members is fixedly secured to a respective one of said semiconductor devices by an adhesive.

5. The electronic package according to claim 2 wherein each of secured to a respective one of said semiconductor devices.

6. The electronic package according to claim 5 wherein each of said first heat sink members is thermally coupled to a respective one of said semiconductor devices by thermal grease.

7. The electronic package according to claim 1 wherein said base member includes upstanding sides as part thereof, said sides extending substantially about the periphery of said first circuitized substrate.

8. The electronic package according to claim 7 wherein said upstanding sides of said base member each define a first ledge thereon, said second common heat sink member being positioned on said first ledges defined by said sides.

9. The electronic package according to claim 7 further including means to support said first heat sink members at a spaced location above said first circuitized substrate and in thermal contact with said second, common heat sink member.

10. The electronic package according to claim 9 wherein said support means comprises at least one beam member located on said first circuitized substrate, said first heat sink members being located on said beam member.

11. The electronic package according to claim 9 wherein, said support means comprises at least one beam member extending substantially across said base member and being spacedly located above the upper surface of said first circuitized substrate, said first heat sink members being located on said beam member.

12. The electronic package according to claim 11 wherein at least two of said upstanding sides of said base member each include a second ledge therein, said beam member being located on and supported by said second ledges.

13. An electronic package comprising:
a base member;
a first circuitized substrate positioned on said base member and including first and second, opposing sides;
at least two semiconductor devices electrically coupled to said first circuitized substrate on one of said sides thereof;
at least two flexible circuitized substrates, each of said flexible circuitized substrates electrically connected to said first of said sides of said first circuitized substrate and to a respective one of said semiconductor devices to provide said electrical coupling to said first circuitized substrate; and
a common heat sink member securedly positioned to said second opposing side of said first circuitized substrate and thermally coupled to each of said semiconductor devices, said flexible circuitized substrates and said first circuitized substrate providing a path for heat removal for each of said semiconductor devices during operation thereof, said common heat sink member also functioning as a stiffening member for said first circuitized substrate.

14. The electronic package according to claim 13 wherein said base member is removably positioned within said package to thereby facilitate repair and/or replacement of selected ones of said first circuitized substrates and/or said semiconductor devices without requiring disturbance of others of said first circuitized substrates and/or said semiconductor devices.

15. The electronic package according to claim 13 wherein said base member includes upstanding sides as part thereof, said sides extending substantially about the periphery of said first circuitized substrate.

16. The electronic package according to claim 15 wherein said upstanding sides of said base member define a ledge thereon, said first circuitized substrate being positioned on said ledges defined by said sides.

17. The electronic package according to claim 13 wherein said common heat sink member is secured to said second opposing side of said first circuitized substrate using a thermally conductive adhesive.

* * * * *